(12) United States Patent
Kowalczyszyn et al.

(10) Patent No.: US 9,088,107 B2
(45) Date of Patent: Jul. 21, 2015

(54) HOUSING FOR CONTAINING ELECTRONIC COMPONENTS THEREIN

(76) Inventors: Taras Kowalczyszyn, Kingston (CA); Ken Hotte, Kingston (CA)

(\*) Notice: Subject to any disclaimer, the term of this patent is extended or adjusted under 35 U.S.C. 154(b) by 0 days.

(21) Appl. No.: 13/993,395

(22) PCT Filed: Dec. 16, 2011

(86) PCT No.: PCT/CA2011/001376
§ 371 (c)(1),
(2), (4) Date: Jun. 12, 2013

(87) PCT Pub. No.: WO2012/079158
PCT Pub. Date: Jun. 21, 2012

(65) Prior Publication Data
US 2013/0265704 A1    Oct. 10, 2013

Related U.S. Application Data

(60) Provisional application No. 61/457,047, filed on Dec. 16, 2010.

(51) Int. Cl.
*H01R 13/6476* (2011.01)
*H01R 13/6473* (2011.01)
*H05K 5/02* (2006.01)

(52) U.S. Cl.
CPC .......... *H01R 13/6473* (2013.01); *H05K 5/0217* (2013.01); *H05K 5/0247* (2013.01)

(58) Field of Classification Search
CPC . H01R 13/6476; H05K 5/0217; H05K 5/0247
USPC .......................... 181/198, 202; 439/578, 596; 361/679.01
See application file for complete search history.

(56) References Cited

U.S. PATENT DOCUMENTS

| | | | | |
|---|---|---|---|---|
| 5,284,447 | A * | 2/1994 | Kristiansen | 439/425 |
| 5,562,477 | A * | 10/1996 | Moore et al. | 439/383 |
| 6,598,701 | B1 * | 7/2003 | Wood et al. | 181/290 |
| 6,617,002 | B2 * | 9/2003 | Wood | 428/131 |
| 6,736,646 | B2 * | 5/2004 | Takahashi et al. | 439/39 |
| 7,073,624 | B2 | 7/2006 | Decanio et al. | |
| 2007/0141891 | A1 * | 6/2007 | Koyama et al. | 439/358 |

FOREIGN PATENT DOCUMENTS

JP    07-231492    8/1995

OTHER PUBLICATIONS

PCT, International Search Report, International Application No. PCT/CA2011/001376 (mailed Apr. 16, 2012, published Jun. 21, 2012).
Georgiev, V.B. et al., "Recent progress in vibration reduction using Acoustic Black Hole effect," 10ème Congrès Français d'Acoustique, Lyon, France (6 pages) (Apr. 12-16, 2010).

\* cited by examiner

*Primary Examiner* — Jeremy Luks
(74) *Attorney, Agent, or Firm* — Thompson Hine LLP

(57) ABSTRACT

A housing for containing at least an electronic component therein is provided. At least a tuning element is disposed in a wall of the housing at a predetermined location. The at least a tuning element forms an opening having a pilot aperture with a countersink aperture connected thereto. The pilot aperture and the countersink aperture are determined such that the housing has a tuned mechanical frequency response for improving the signal quality of an electric signal transmitted therein or therethrough.

12 Claims, 6 Drawing Sheets

HOUSING FOR CONTAINING ELECTRONIC COMPONENTS THEREIN

RELATED APPLICATION DATA

This application is a national stage filing of International Application No. PCT/CA2011/001376, filed Dec. 16, 2011, which claims the benefit of U.S. Provisional Application No. 61/457,047 filed Dec. 16, 2010. The entire contents of both of these applications are incorporated by reference herein.

FIELD OF THE INVENTION

The present invention relates to mechanical vibrations in structures, and more particularly, to a housing for containing electronic components therein having a tuned mechanical frequency response for improving the signal quality of electric signals transmitted therein or therethrough.

BACKGROUND OF THE INVENTION

Modern high-end audio and home theater systems have reached such a high standard of the audio signals generated that experienced listeners are able to perceive very subtle distortions thereof. For example, an experienced listener is now enabled to perceive distortions caused by noise created by the mechanical impedance mismatch occurring at the junction of the connector with the wire assembly of a typical inter-connect and the component into which the connector is plugged into as well as mechanical vibrations of the housings of the audio or home theater system—such as, for example, housings of connectors and housings of components (CD player, amplifier, etc.) of the system—affecting the electric signals transmitted therein/therethrough.

Furthermore, other electronic equipment such as, for example, computers, operate at such high speeds and data are transferred at such high transmission rates that even subtle distortions of the electric signals transmitted therein/therethrough caused by mechanical impedance mismatch and mechanical vibrations of the housings can impede proper operation.

It is desirable to provide a housing for containing electronic components therein having a tuned mechanical frequency response for improving the signal quality of electric signals transmitted therein or therethrough.

It is also desirable to provide a housing for containing electronic components therein having a tuned mechanical frequency response for improving the signal quality of electric signals transmitted therein or therethrough that is simple and cost effective.

SUMMARY OF THE INVENTION

Accordingly, one object of the present invention is to provide a housing for containing electronic components therein having a tuned mechanical frequency response for improving the signal quality of electric signals transmitted therein or therethrough.

Another object of the present invention is to provide a housing for containing electronic components therein having a tuned mechanical frequency response for improving the signal quality of electric signals transmitted therein or therethrough that is simple and cost effective.

According to one aspect of the present invention, there is provided a housing for containing at least an electronic component therein. At least a tuning element is disposed in a wall of the housing at a predetermined location. The at least a tuning element forms an opening having a pilot aperture with a countersink aperture connected thereto. The pilot aperture and the countersink aperture are determined such that the housing has a tuned mechanical frequency response for improving the signal quality of an electric signal transmitted therein or therethrough.

An advantage of the present invention is that it provides a housing for containing electronic components therein having a tuned mechanical frequency response for improving the signal quality of electric signals transmitted therein or therethrough.

A further advantage of the present invention is that it provides a housing for containing electronic components therein having a tuned mechanical frequency response for improving the signal quality of electric signals transmitted therein or therethrough that is simple and cost effective.

BRIEF DESCRIPTION OF THE DRAWING

A preferred embodiment of the present invention is described below with reference to the accompanying drawing, in which.

DESCRIPTION OF THE PREFERRED EMBODIMENT

Unless defined otherwise, all technical and scientific terms used herein have the same meaning as commonly understood by one of ordinary skill in the art to which the invention belongs. Although any methods and materials similar or equivalent to those described herein can be used in the practice or testing of the present invention, certain preferred methods and materials are now described.

While embodiments of the invention will be described for reducing noise caused by the mechanical impedance mismatch occurring at an RCA inter-connect, it will become evident to those skilled in the art that the embodiments of the invention are not limited thereto, but are applicable for various other inter-connects such as, for example, XLR inter-connects as well as for reducing mechanical noise in housings for containing electronic components such as, for example, CD-players, amplifiers, and computers.

Recent research has proposed drilling of holes—called Acoustic Black Holes (ABH)—in structures such as plates or beams as a means to dampen structural vibrations therein, as disclosed in, for example, Vasil B. Georgiev et al. "Recent Progress in Vibration Reduction Using Acoustic Black Hole Effect", 10eme Congres Francais d'Acoustique, Lyon, 12-16 Apr. 2010. The authors stated that the truncated edge of the ABH creates a reflected wave. The reflected wave causes noise and partially cancels the desired effect of the ABH, i.e. the dampening of the structural vibrations, and, therefore, makes a practical application unattractive.

According to one aspect of the invention it has been found that by changing the width and depth of a countersunk ABH it is possible to tune the frequency response of a housing comprising one or more countersunk ABH in a predetermined fashion, i.e., the one or more countersunk ABH are determined such that the wave reflected at the edge between a pilot aperture and a wider countersunk aperture—called edge noise in the above cited reference Georgiev et al.—is used for tuning the frequency response of the housing such that the signal quality of electric signals transmitted therein or therethrough is improved. The frequency response is a result of attenuation of the housing and the edge noise.

Figure 1A:
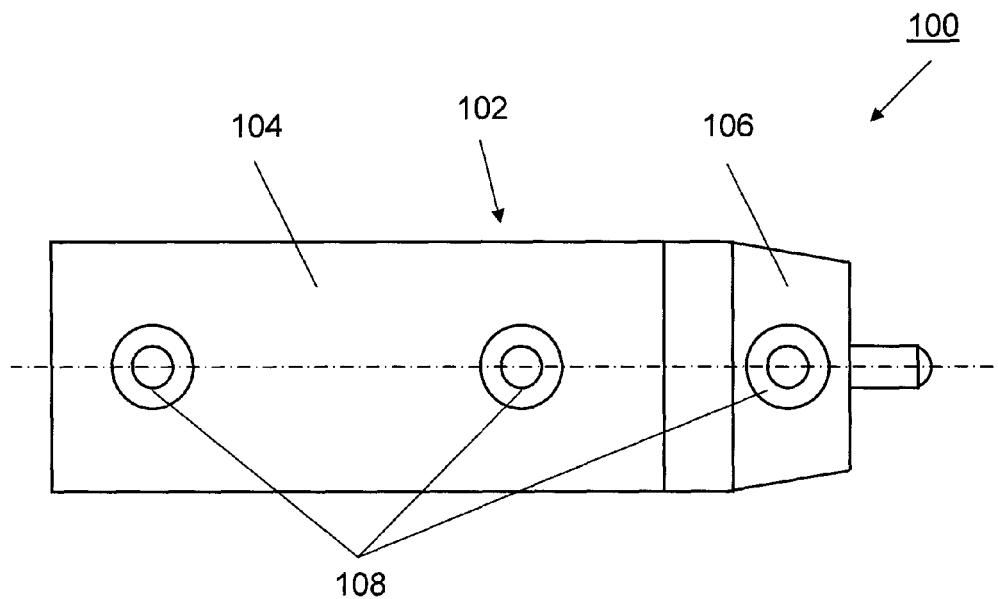
FIGS. 1a and 1b are simplified block diagrams illustrating a side view of a male and female portion of an RCA inter-connect, respectively, comprising a tuning element according to a preferred embodiment of the invention.
Figure 1B:
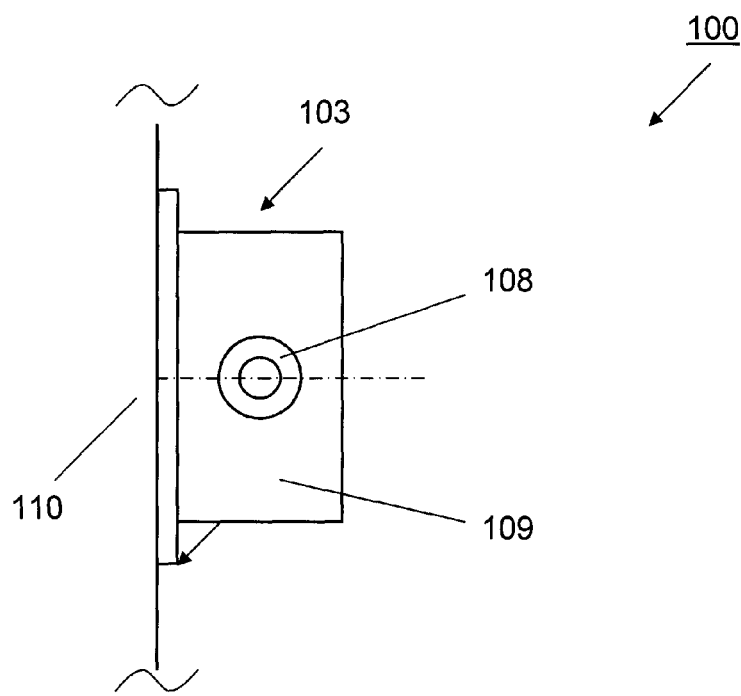

Referring to FIGS. 1a and 1b, a male and a female connector, respectively, of an RCA inter-connect 100 comprising tuning elements 108 according to a preferred embodiment of the invention is shown. The male RCA connector 102, shown in FIG. 1a comprises a body structure 104 for accommodating a conductor or wire therein and a barrel 106 for mating with a respective female connector 103. The male RCA connector 102 further comprises the tuning elements 108 in the form of ABHs, for example, disposed along a single line with two being disposed in the body structure 104 and 1 being disposed in the barrel 106. The female RCA connector 103 comprises a connecting structure 109 for being mated with the barrel 106 of the male RCA connector 102. The female RCA connector 103 is, for example, mounted to an electronic device 110 such as an amplifier.

Figure 2A:
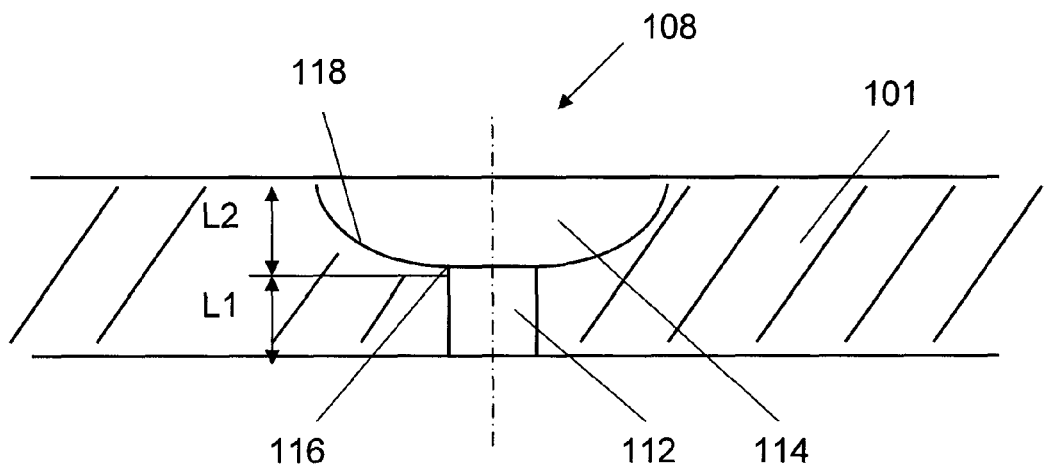
FIGS. 2a to 2f are simplified block diagrams illustrating cross sectional views of tuning elements according to preferred embodiments of the invention; and, FIGS. 3a to 3d are simplified block diagrams illustrating top views of tuning elements according to preferred embodiments of the invention.
Figure 3A:
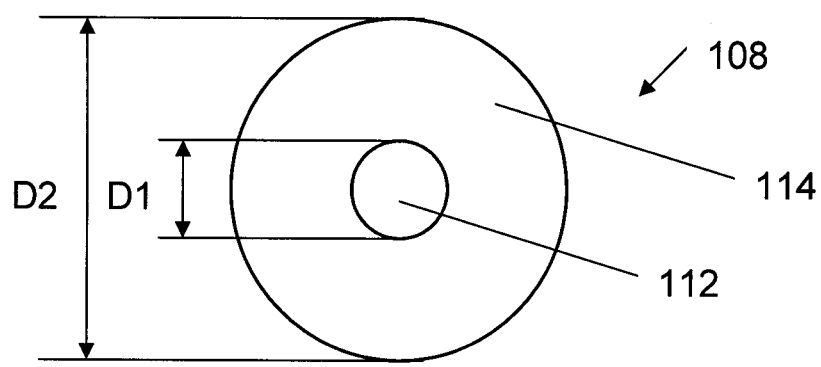

The tuning elements 108 according to the preferred embodiment of the invention forms an opening in the wall 101 of the respective housing comprising a pilot aperture 112 and a countersink aperture 114, as illustrated in FIGS. 2a and 3a. Preferably, the pilot aperture 112 and the countersink aperture 114 have a circular cross section and the surface of the countersink hole 114 is curved in a predetermined fashion. The wave reflected at the edge 116 between the pilot aperture 112 and the wider countersink aperture 114 is used for tuning the frequency response of the housing in a predetermined fashion for specific applications by varying, for example: the lengths L1 and L2 of the pilot aperture 112 and the countersink aperture 114; the diameters D1 and D2 of the pilot aperture 112 and the countersink aperture 114; and the shape of the surface of the countersink hole.

Figure 2B:
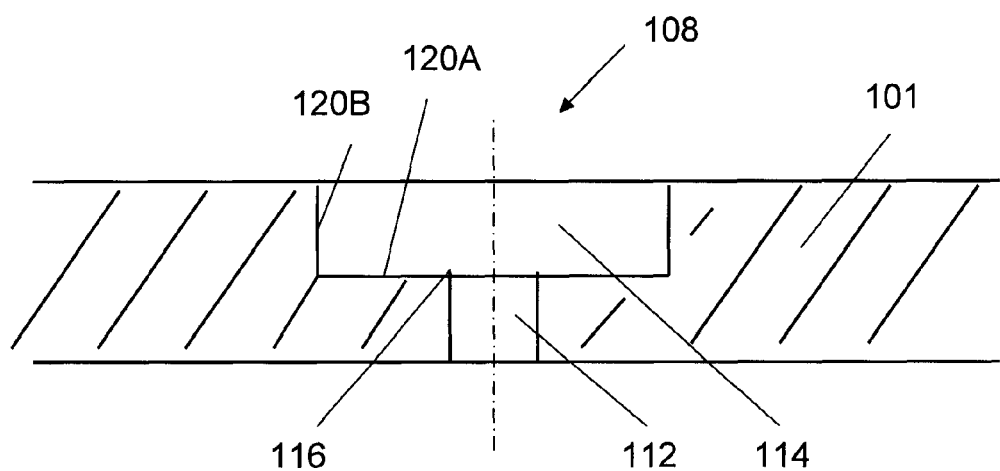
Figure 2C:
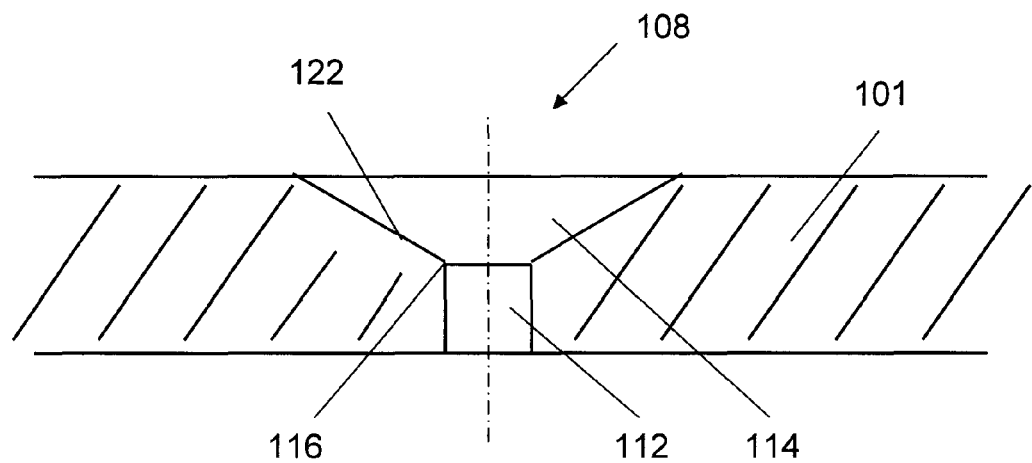

Alternatively, the cross section of the countersink aperture 114 is constant and abruptly changes to the cross section of the pilot aperture 112, as illustrated in FIG. 2b. Further alternatively, the surface of the countersink aperture 114 has a straight slope towards the pilot aperture 112, as illustrated in FIG. 2c.

Figure 2D:
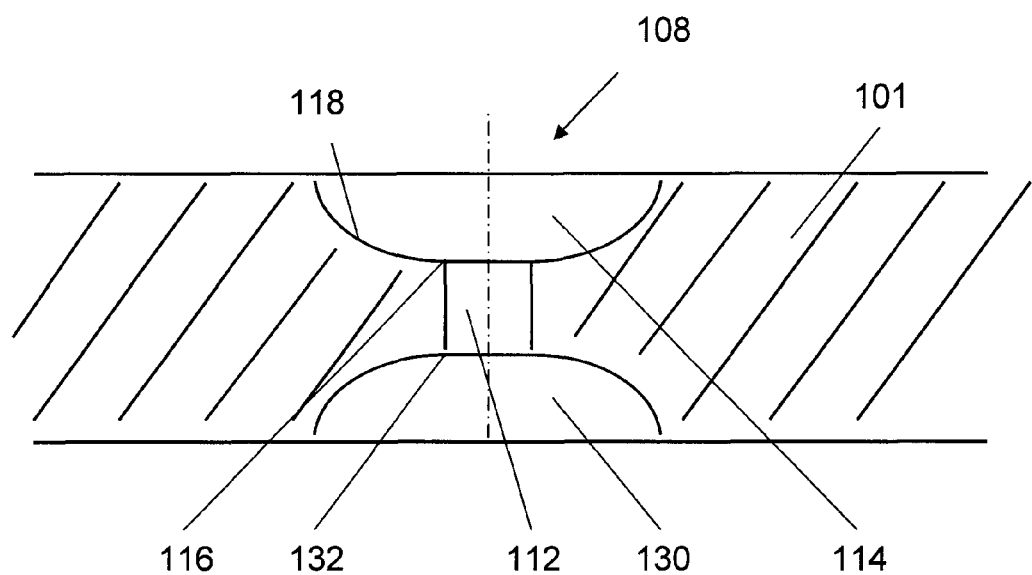

Referring to FIG. 2d, a second countersink aperture 130 is connected to the pilot aperture 112 opposite the countersink aperture 114 forming a second edge 132. The second countersink aperture 130 is of same shape and size as the countersink aperture 114 or, alternatively, of different shape and size.

Figure 2E:
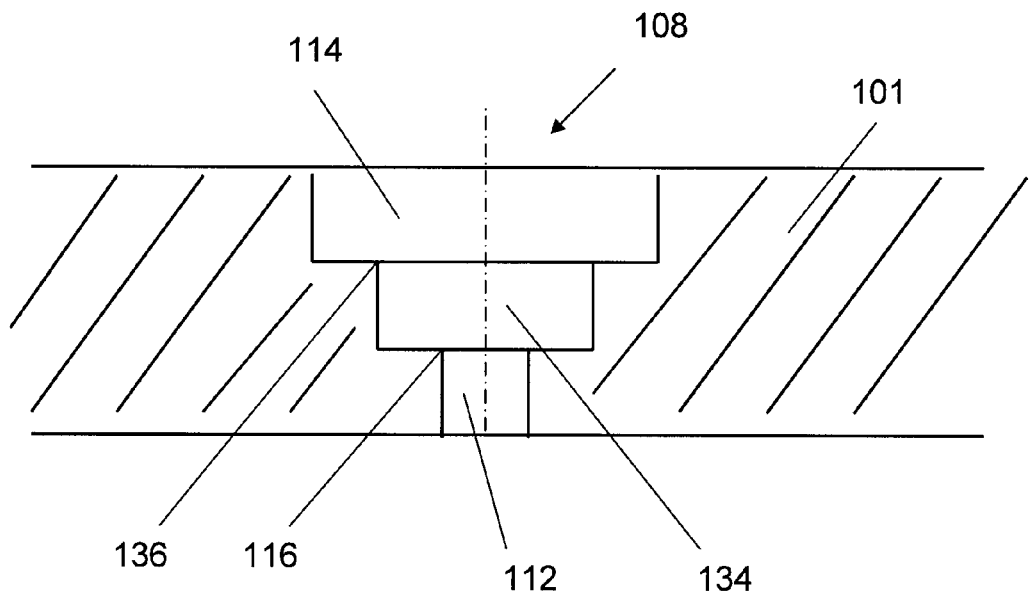
Figure 2F:
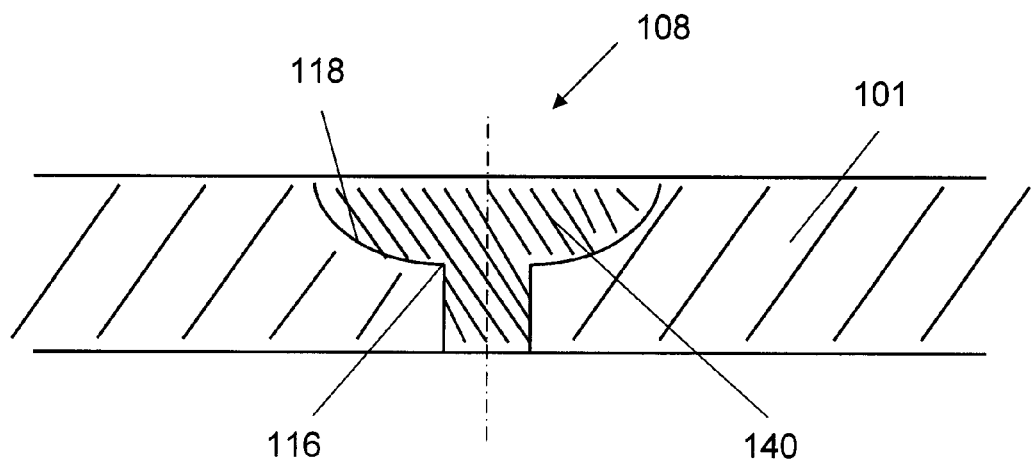

Further alternatively, a second edge 136 is provided by interposing a second countersink aperture 134 between the pilot aperture 112 and the countersink aperture 114, as illustrated in FIG. 2e. Optionally, the pilot aperture 112 and the countersink aperture 114 are filled with a material 140 having a mechanical impedance that is different than the mechanical impedance of the material of the wall 101, as illustrated in FIG. 2f, providing a further tuning ability.

Figure 3B:
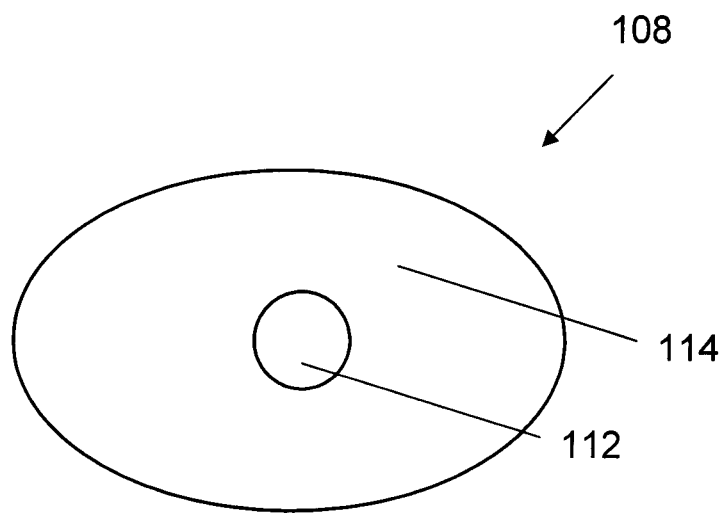

Further optionally, the pilot aperture 112 and the countersink aperture 114 have a cross section other than a circular cross section. For example, the countersink aperture 114 has a cross section forming an ellipse and the pilot aperture 112 has a circular cross section, as illustrated in FIG. 3b. Alternatively, the pilot aperture 112 has also an elliptical cross section with the ellipse having a same orientation than the ellipse of the countersink aperture 114 or, further alternatively, has a different orientation.

Figure 3C:
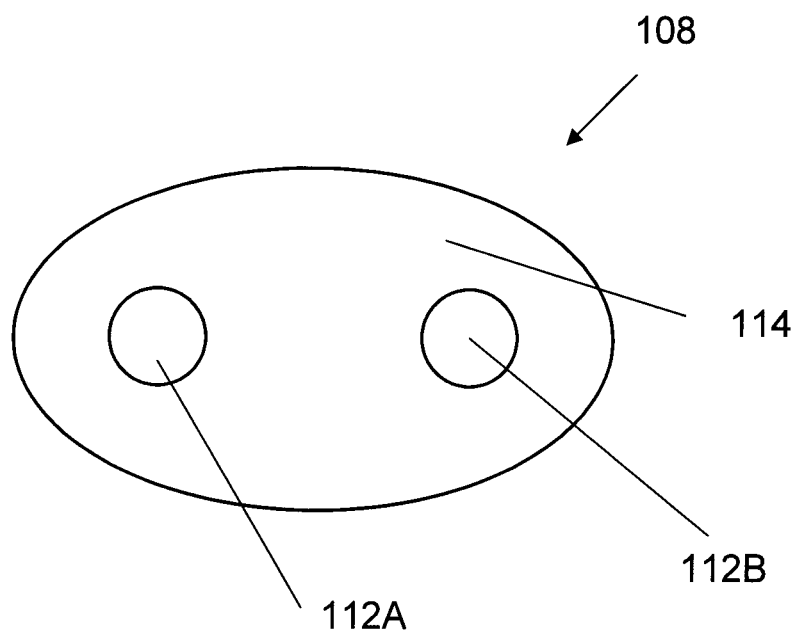
Figure 3D:
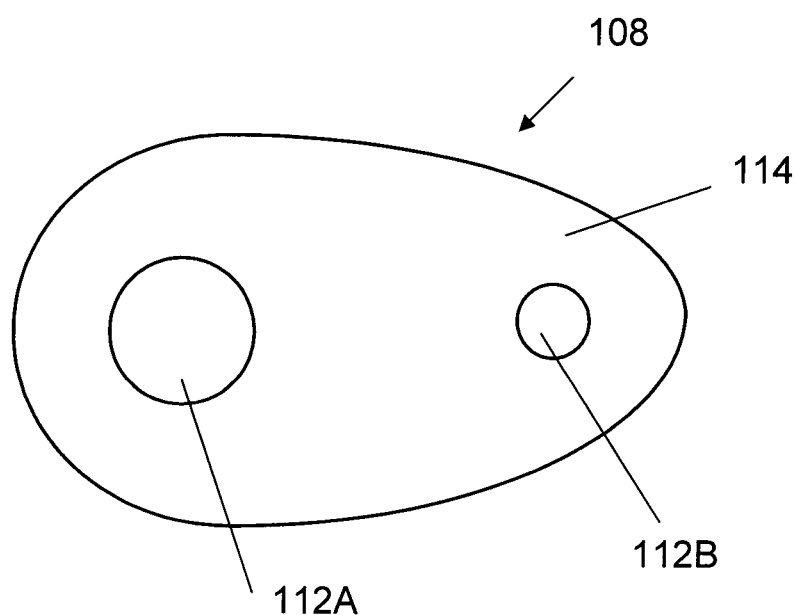

Yet further optionally, a plurality of pilot apertures 112 is connected to a countersink aperture 114. For example, the countersink aperture 114 has a cross section forming an ellipse and two pilot apertures 112 are connected thereto at the foci of the ellipse, as illustrated in FIG. 3c. Alternatively, the countersink aperture 114 has an egg shaped cross section with, for example, pilot apertures of different diameter and the pilot aperture 112A with the larger diameter being placed in the wider portion of the countersink aperture 114, as illustrated in FIG. 3d.

The tuning elements are provided in walls of various types of housings such as, for example, connectors and box-shaped housings of electronic components (CD players, amplifiers, computers, etc.) made of various materials such as, for example, metal, plastic, and wood using standard drilling and/or milling processes. Alternatively, the tuning elements are provided during a molding process. Shape, size, and placement of the tuning elements are determined in dependence upon a mechanical frequency response of the respective housing—which depends on: shape; size; wall thickness; and material, of the housing. The determination is performed, for example, in an empirical fashion known to one skilled in the art or in combination with analytical/numerical modeling as taught, for example, in Vasil B. Georgiev et al. "Recent Progress in Vibration Reduction Using Acoustic Black Hole Effect", 10eme Congres Francais d'Acoustique, Lyon, 12-16 Apr. 2010.

In an example implementation using a NEUTRIK™ RCA all inter-connects, as illustrated in FIGS. 1a and 1b, for high-end audio equipment achieving a substantial reduction in signal distortions and producing a resonant environment that is pleasant to the limitations of human hearing. Three tuning elements are provided in the wall of the housing having a thickness of 2 mm with the pilot aperture and the countersink aperture each having a length of 1 mm. The pilot aperture and the countersink aperture were drilled using a gauge 57 drill bit (1.092 mm diameter) and a gauge 32 drill bit (2.946 mm diameter), respectively.

The present invention has been described herein with regard to preferred embodiments. However, it will be obvious to persons skilled in the art that a number of variations and modifications can be made without departing from the scope of the invention as described herein.

The embodiments of the invention in which an exclusive property or privilege is claimed are defined as follows:

What is claimed is:

1. A housing for containing at least an electronic component therein, the housing comprising at least a tuning element disposed in a wall thereof at a predetermined location, the at least a tuning element forming an opening comprising a pilot aperture and a countersink aperture connected thereto, wherein shape, size and location of the at least a tuning element are determined for tuning the mechanical frequency response of the housing in dependence upon an electric signal transmitted therein or therethrough.

2. A housing as defined in claim 1 wherein a cross section of the countersink aperture gradually changes from a first cross section to a second cross section with the countersink aperture being connected to the pilot aperture at the second cross section.

3. A housing as defined in claim 2 wherein the cross section of the countersink aperture changes such that the countersink aperture comprises a curved surface.

4. A housing as defined in claim 2 wherein the cross section of the countersink aperture changes such that the countersink aperture comprises a straight surface sloped towards the pilot aperture.

5. A housing as defined in claim 1 wherein the cross section of the countersink aperture is constant.

6. A housing as defined in claim 1 wherein the at least a tuning element comprises a second countersink aperture connected to the pilot aperture opposite the countersink aperture.

7. A housing as defined in claim 1 wherein the at least a tuning element comprises a second pilot aperture connected to the countersink aperture.

8. A housing as defined in claim 1 wherein the at least a tuning element comprises a second countersink aperture interposed between the pilot aperture and the countersink aperture.

9. A housing as defined in claim 1 wherein the pilot aperture and the countersink aperture are filled with a material having a mechanical impedance that is different than the mechanical impedance of a material of the wall.

10. A housing as defined in claim 1 wherein the housing forms a housing of an inter-connect.

11. A housing as defined in claim 10 wherein the housing forms a housing of an RCA inter-connect.

12. A housing for containing at least an electronic component therein, the housing comprising at least a tuning element disposed in a wall thereof at a predetermined location, the at least a tuning element forming an opening comprising a pilot aperture and a countersink aperture connected thereto, wherein shape, size and location of the at least a tuning element are determined such that the housing has a tuned mechanical frequency response for reducing distortions of an electric signal transmitted therein or therethrough caused by mechanical impedance mismatch and mechanical vibrations of the housing.

* * * * *